United States Patent [19]

Henry

[11] Patent Number: 4,704,722

[45] Date of Patent: Nov. 3, 1987

[54] TIMING RECOVERY CIRCUIT

[75] Inventor: Paul S. Henry, Holmdel, N.J.

[73] Assignee: American Telephone and Telegraph Company, AT&T Bell Laboratories, Murray Hill, N.J.

[21] Appl. No.: 622,737

[22] Filed: Jun. 20, 1984

Related U.S. Application Data

[63] Continuation-in-part of Ser. No. 388,026, Jun. 14, 1982, abandoned.

[51] Int. Cl.[4] .............................................. H03D 3/24
[52] U.S. Cl. .................................. 375/120; 351/1 A; 307/510
[58] Field of Search ............... 375/80, 81, 97, 110, 375/119, 94, 120; 331/1 R, 1 A, 25, 26, 28, 145, 172, 173, 17; 358/158; 455/260, 265; 329/122; 328/133, 142, 144; 307/231, 510, 511, 514

[56] References Cited

U.S. PATENT DOCUMENTS

| 3,209,261 | 9/1965 | Critchlow | 370/110 |
|---|---|---|---|
| 3,311,442 | 3/1967 | Jager et al. | 370/20 |
| 3,493,868 | 2/1970 | Hackett, Jr. | 375/110 |
| 3,654,564 | 4/1972 | Tisi et al. | 375/97 |
| 3,742,372 | 6/1973 | Uchida et al. | 375/119 |
| 3,800,231 | 3/1974 | Pratt | 455/265 |
| 4,074,207 | 2/1978 | Forsberg | 331/1 A |
| 4,162,446 | 7/1979 | Cochran | 455/77 |
| 4,276,650 | 6/1981 | de Jager et al. | 375/110 |
| 4,464,771 | 8/1984 | Sorensen | 375/120 |
| 4,527,080 | 7/1985 | Zweig | 307/510 |
| 4,546,275 | 10/1985 | Pena-Finol et al. | 328/144 |

OTHER PUBLICATIONS

Floyd Gardner, "Phaselock Techniques", 1966 John Wiley Son Inc., pp. 116-119.

Primary Examiner—Robert L. Griffin
Assistant Examiner—Stephen Chin
Attorney, Agent, or Firm—Richard D. Laumann

[57] ABSTRACT

Prior art circuits for recovering timing information from baseband digital signals include a rectifier and a separate phase detector for controlling the phase of a phase-locked voltage-controlled oscillator. In the circuit described herein, an antiparallel diode pair is used to perform the two functions of rectification and phase detection. The resulting timing circuit is, thereby, simplified. Alternatively, a dual-gate field effect transistor may be used.

12 Claims, 6 Drawing Figures

TIMING RECOVERY CIRCUIT

This application is a continuation-in-part of my co-pending application Ser. No. 388,026, filed June 14, 1982 now abandoned.

TECHNICAL FIELD

This application relates to timing recovery circuits for use in digital communication systems.

BACKGROUND OF THE INVENTION

A digital PCM signal comprises a random sequence of binary digits which occur at a regular periodic rate. To detect and regenerate such a signal it is necessary to provide a clock signal that is synchronous with the signal. This clock can be provided through a separate path, or it can be derived from the incoming data stream. The latter is typically accomplished by a process which includes rectifying the data stream and then applying the rectified signal to a phaselocked voltage-controlled oscillator. (See *Phaselock Techniques* by F. M. Gardner, pp. 117-119, published by John Wiley and Sons, Inc., 1966.) This is a two-step process which employs a rectifier circuit and a separate phase detector in the oscillator loop.

SUMMARY OF THE INVENTION

In accordance with the present invention, an antiparallel diode pair is used to perform the two functions of rectification and phase detection in a timing recovery circuit. The circuit comprises, in cascade, a differentiator; an antiparallel diode pair; a low-pass filter; and a voltage-controlled oscillator. The output signal from the oscillator, which is the desired timing signal, is connected by means of a feedback loop to the input end of the circuit. Still other embodiments are contemplated. For example, a dual-gate field effect transistor (FET), rather than an antiparallel connected diode pair, may be used. Still more generally, any nonlinear electrical device generating an error signal proportional to the product of the square of the differentiated data signal and the voltage controlled oscillator may be used.

DETAILED DESCRIPTION

Figure 1:
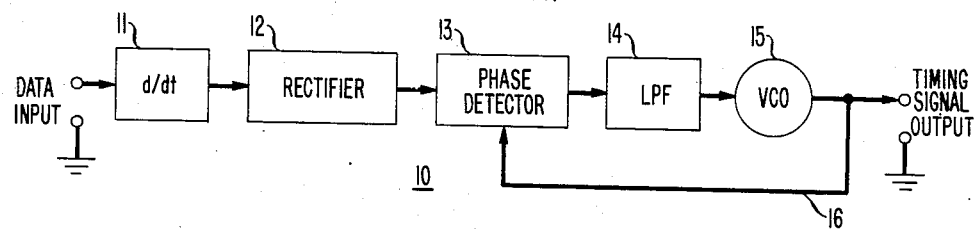
FIG. 1 shows a typical prior art timing recovery circuit.

Referring to the drawings, FIG. 1 shows, in block diagram, a prior art timing recovery circuit 10 comprising a separate rectifier and phase detector. More particularly, the circuit coprises, in cascade, a differentiator 11 (d/dt); a rectifier 12; a phase detector 13; a low-pass filter (LPF) 14; and a voltage-controlled oscillator (VCO) 15. To complete the phase locked loop, the output signal from the VCO, which is the desired timing signal, is fed back by means of signal path 16 to the phase detector 13.

Figure 2:
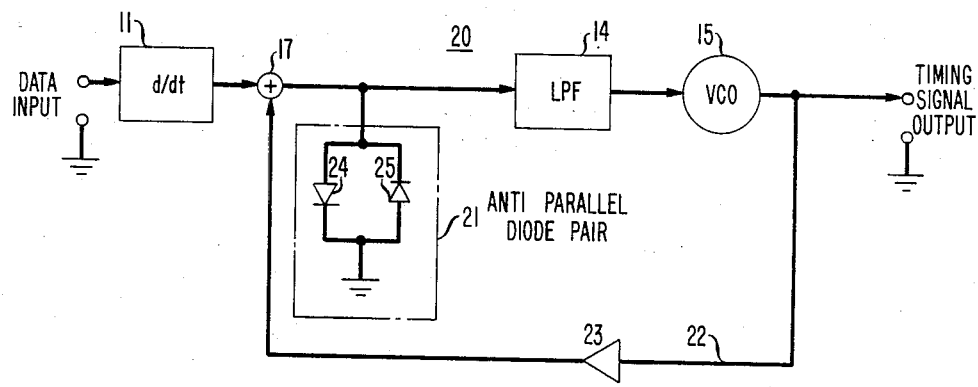
FIG. 2 shows a timing recovery circuit in accordance with the present invention.

As can be seen in FIG. 1, in the prior art timing circuit shown, rectification and phase detection are separately performed in the respective circuits 12 and 13. In accordance with the present invention, these functions are performed in a common circuit in a digital receiver. Using the same identification numerals to identify corresponding circuit functions, FIG. 2 shows a timing recovery circuit in accordance with the present invention comprising, in cascade, a differentiator 11 (d/dt); an antiparallel diode pair 21; a low-pas filter 14; and a voltage-controlled oscillator 15. In this timing circuit, the phase locked loop is closed by means of a feedback path 22 which couples the oscillator output signal to a summing circuit 17, located at the output of the differentiator 11. Alternatively, the feedback path can be connected to the input port of the differentiator. A buffer amplifier 23 is advantageously included in feedback path 22 so as to isolate the output timing signal from the differentiated data signal.

Figure 3:
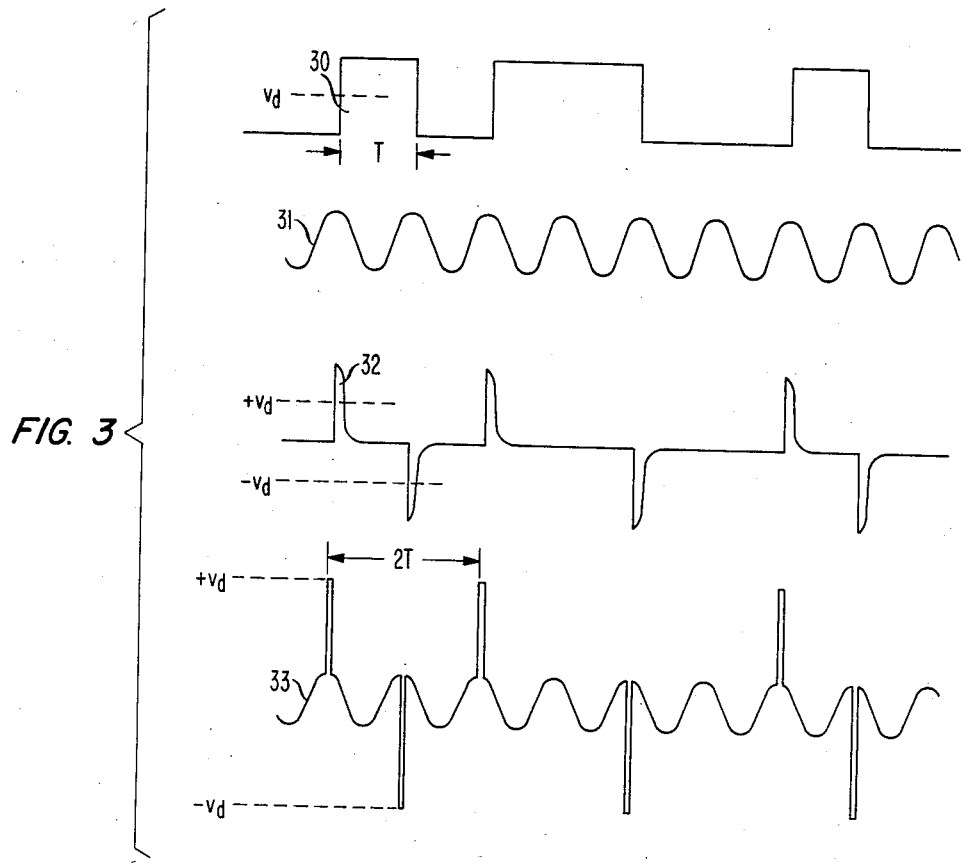
FIG. 3 shows typical signal waveshapes at different points in the circuit of FIG. 2.

The operation of the timing circuit of FIG. 2 can be readily explained by reference to FIG. 3, which shows voltage waveforms at various points in the timing circuit. These include an arbitrary NRZ input data signal 30 which, for the purposes of this explanation, is assumed to be large compared to the voltage, $v_d$, necessary to drive the diodes 24 and 25 into conduction. Curves 31 and 32 show the oscillator signal and the differentiated data signal at the output of differentiator 11 with the diode pair 21 disconnected. For purposes of this explanation it is further assumed that the amplitude of the oscillator signal is smaller than $v_d$ and that the phase of the oscillator signal is such that the pulses produced at the leading and trailing edges of the data signal pulses coincide with the positive peaks of the oscillator waveform.

Curve 33 shows the resulting waveform obtained when the diode pair is connected.

Because the oscillator signal is smaller than $v_d$, the diodes are open circuits in the presence of the oscillator signal alone. However, in the presence of the combined oscillator and differentiated data signals, one or the other of the oppositely poled diodes is driven into conduction, clamping the voltage across the diode pair at $v_d$.

Because of the assumed phase, it is noted that conduction occurs only during the positive half cycles of the oscillator signal. Furthermore, because the differentiated data pulses occur in pairs of opposite polarity, they generate no average (i.e., d.c.) current. The do, however, reduce the area contained within the positive voltage portion of the combined waveform, resulting in a net negative voltage at the output of the low-pass filter 14.

Figure 4:
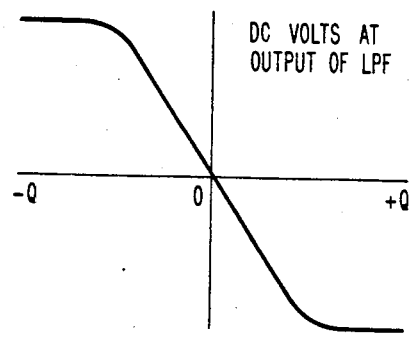
FIG. 4 shows the resulting phase versus oscillator control voltage characteristic for said circuit.

If this analysis is repeated for different relative phases of the oscillator and differentiated data pulses, a phase versus oscillator control voltage characteristic of the type shown in FIG. 4 is obtained, where the relative phase $\phi$ is measured between the differentiated data pulses and the zero crossing of the voltage signal. As can be seen, the oscillator will phase lock such that its zero crossings will coincide approximately with the center of the differentiated data pulses.

The operation of the circuit depicted in FIG. 2 may be better understood by considering the following. An antiparallel diode pair has a current voltage characteristic having odd symmetry, that is, its current-voltage characteristic has the property shown by Equation (1), namely, $$I(v) = -I(-v) \quad (1)$$

where I is the current through the pair and v is the voltage across the pair. If a power series expansion of I is now formed, it will obviously contain only odd powers of v. Since v is the voltage across the diode pair, it may be represented as the sum of the differentiated data signal, $v_d$, and the voltage controlled oscillator output, $v_v$. If this expression for the voltage is now substituted into the power series expansion of I and only the nonlinear terms are kept, the expression for the current voltage characteristic is $$I(v) \sim v_d{}^3 + 3v_d{}^2 \cdot v_v + 3v_d v_v{}^2 + v_v{}^3 + \ldots \quad (2)$$

However, $v_d$ has zero spectral density at dc because it is the output of a differentiator and the spectrum of $v_v$ is a discrete line at the voltage control oscillator frequency. Consequently, only the second term in Equation (2) has a nonspectral density at dc and it should be noted that it has precisely the form needed for timing recovery using a phase-locked loop. The use of a low-pass filter permits extraction of the error signal from the diode pair.

Figure 5:
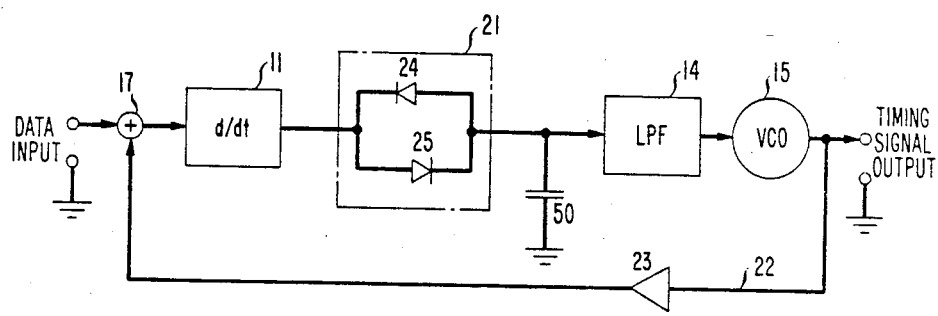
FIG. 5 shows an alternate embodiment of the invention.

While an NRZ data stream was conveniently employed to describe the operation of the invention, its operation is not limited to any particular signal format. For example, it will operate just as well with a simple on-off (i.e., RZ) binary signal, a bipolar signal, or a multilevel signal. In the embodiment of FIG. 2 diode pair 21 is shunt-connected. FIG. 5 shows an alternative embodiment of the invention wherein the diode pair 21 is series-connected. In addition, summing circuit 17 is located at the input of the differentiator 11. A capacitor 50 provides an r.f. return path. In all other respects, the embodiment of FIG. 5 is the same as FIG. 2.

Figure 6:
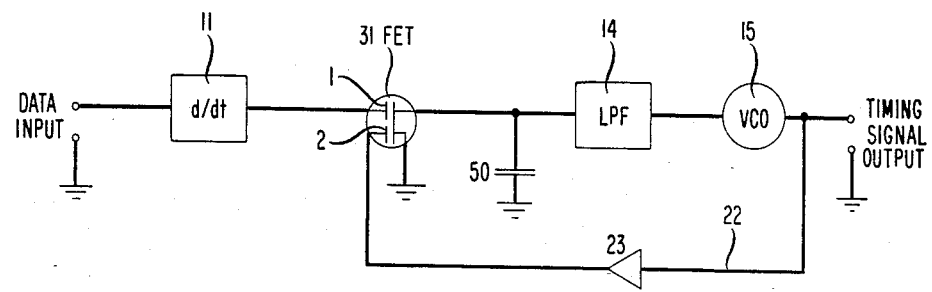
FIG. 6 shows yet another embodiment of this invention.

Although this invention has been described with respect to a specific embodiment using an antiparallel connected diode pair, it will be readily appreciated by those skilled in the art that other devices can be used in digital receivers if they also generate an error signal having the appropriate form previously discussed. A circuit for a digital receiver using one such device is depicted in FIG. 6. This circuit uses a dual-gate field effect transistor with the voltage controlled oscillator signal being applied to gate 1 and the data signal being applied to gate 2. Although a dual-gate FET is depicted it will be readily appreciated that two FETs may be used with the source of one connected to the drain of the other. The term dual-gate is used to cover this embodiment as well as the single FET.

An FET has parabolic transfer characteristics, that is, the output current, with respect to the applied voltage, is proportional to a constant term plus the linear term as well as a quadratic term. Typically, the coefficient of quadratic term is small. Thus, when a series expansion is made of the output current in terms of the voltages applied to both gates, three terms are obtained of which two are nominally constant and the third is proportional to the phase difference between the voltage controlled oscillator and the incoming data. This term can be used to lock the voltage controlled oscillator.

The previous discussion of the circuit operation assumed that all circuit components operated ideally. However, in practice, nonideality in the circuit components should be considered to precisely analyze circuit performance. The most important nonideality is probably the nonsymmetric clamping characteristic produced by diode imbalance. This produces a voltage term having both a dc offset and a noise continuum. In practice, the dc offset may be removed by adding an external compensating voltage to the error signal. Unfortunately, the noise cannot be removed and imposes a fluctuation on the error signal. Calculations show, however, that the degradation in digital receiver performance resulting from the fluctuation in the error signal is negligible, for example, less than 0.1 dB.

It will now be appreciated that any nonlinear electrical device having two controlling electrodes with the current-voltage characteristic of one being nonlinear and with the current flowing serially through the device may be used.

What is claimed is:

1. A timing recovery circuit, said circuit having an input end, comprising, in cascade; a differentiator, said differentiator having an input port and being connected to said input end; an antiparallel diode pair; a lowpass filter; and a voltage-controlled oscillator, said oscillator having an output port;
   and feedback means for coupling between said output port of said oscillator and the input end of said circuit.

2. The circuit according to claim 1 including a summing circuit for combining the output signal from said differentiator and the output signal from said feedback means and for coupling the signals thus combined to said diode pair.

3. The circuit according to claim 1 including means for applying a digital signal to the input port of said differentiator;
   and means for extracting a timing signal from the output port of said oscillator.

4. The circuit according to claim 3 wherein said means for applying a digital signal includes a summing circuit having a first input port for receiving input data signals; a second input port connected to said feedback means; and an output port connected to the input port of said differentiator.

5. The circuit according to claim 3 wherein the amplitude of the differentiated data signal applied to said diode pair is greater than the voltage $v_d$ required to cause conduction in said diodes;
   and wherein the peak amplitude of the oscillator signal applied to said diode pair is less than $v_d$.

6. The circuit according to claim 1 wherein said diode pair is shunt-connected with said cascade connected elements.

7. The circuit according to claim 1 wherein said diode pair is series-connected with said cascade connected elements.

8. A digital receiver having a timing recovery circuit, said circuit having an input port, comprising in cascade; a differentiator; a nonlinear electrical device; a low-pass filter; and a voltage controlled oscillator, said nonlinear device having at least one controlling electrode and comprising a phase detector; said oscillator having an output port; said nonlinear electrical device generating an error signal proportional to the product of the square of the differentiated data signal and the voltage controlled oscillator signal and feedback means for coupling between the output port of said oscillator and one of said controlling electrodes.

9. A digital receiver as recited in claim 8 in which said electrical device comprises an antiparallel diode pair.

10. A digital receiver as recited in claim 8 in which said device comprises a dual-gate field effect transistor, said transistor comprising first and second gate electrodes, said electrodes being controlling electrodes.

11. A digital receiver according to claim 10 in which the output of said differentiator is applied to said first gate electrode.

12. A digital receiver according to claim 11 in which the output of said voltage controlled oscillator is applied to said second gate electrode.

* * * * *